US006545426B1

(12) United States Patent
Chen

(10) Patent No.: US 6,545,426 B1
(45) Date of Patent: Apr. 8, 2003

(54) CONTROL CIRCUIT USING PIEZOELECTRIC CERAMIC TRANSFORMER FOR DRIVING BACK-LIGHT DEVICES

(75) Inventor: I-Cheng Chen, Taipei Hsien (TW)

(73) Assignee: King Ultrasound Co., Ltd., Taipei Hsien (TW)

(*) Notice: Subject to any disclaimer, the term of this patent is extended or adjusted under 35 U.S.C. 154(b) by 0 days.

(21) Appl. No.: 09/987,182

(22) Filed: Nov. 13, 2001

(51) Int. Cl.[7] .................................... H01L 41/08

(52) U.S. Cl. ........................ 315/209 PZ; 310/316.01; 315/209 R; 315/224

(58) Field of Search ........................ 310/316.01, 317, 310/318, 319; 315/209 PZ, 209 R, 224, 244, 276, 307

(56) References Cited

U.S. PATENT DOCUMENTS

| | | | | | |
|---|---|---|---|---|---|
| 5,942,835 | A | * | 8/1999 | Furuhashi et al. | 310/316.01 |
| 5,998,938 | A | * | 12/1999 | Comberg et al. | 315/209 PZ |
| 6,028,388 | A | * | 2/2000 | Shimada | 310/318 |
| 6,034,484 | A | * | 3/2000 | Danov et al. | 315/209 PZ |
| 6,400,096 | B1 | * | 6/2002 | Wells et al. | 315/224 |
| 6,433,458 | B2 | * | 8/2002 | Nakatsuka et al. | 310/316.01 |
| 6,294,878 | B1 | * | 9/2002 | Murata et al. | 315/209 PZ |

* cited by examiner

*Primary Examiner*—Tho Phan
(74) *Attorney, Agent, or Firm*—Birch, Stewart, Kolasch & Birch, LLP

(57) ABSTRACT

A control circuit using piezoelectric ceramic transformer for driving a back-light device, utilizing a logic control unit, a first feedback circuit, and a second feedback circuit to automatically scan the response frequencies of the piezoelectric ceramic transformer and the back-light device and to drive the back-light device at the best resonance frequency.

19 Claims, 2 Drawing Sheets

CONTROL CIRCUIT USING PIEZOELECTRIC CERAMIC TRANSFORMER FOR DRIVING BACK-LIGHT DEVICES

BACKGROUND OF THE INVENTION

1. Field of Invention

The present invention relates to a control circuit using piezoelectric ceramic transformer for driving a back-light device and, more specifically, to a control circuit that is able to automatically scan the response frequency of the piezoelectric ceramic transformer and to drive the back-light device at the best resonance frequency.

2. Related Art

From the trend of development, the application of back-light cold-cathode tubes has drawn more and more attention. For example, the personal digital assistant (PDA) and the mobile phone display are manufactured using its features such as lightness, thinness, and smallness. The cold-cathode tube, however, is driven by a high voltage high frequency source converted from a direct current source. The conventional transformer uses multiple turns of coils and has its limitation and drawbacks. More turns of coils are needed to obtain a high turns ratio. There are practical difficulty in manufacturing and the arc problem. Furthermore, conventional coil transformers have such drawbacks as magnet damage, electromagnetic interference, electrical leakage, and temperature rise. Therefore, under the trend of light, thin, and small electronics, conventional coil transformers are unable to fulfill the needs. A transformer using the piezoelectric characteristics has been gradually applied to related fields to solve the problems with conventional transformers.

The piezoelectric ceramic transformer (PZT) is a converter that converts electrical energy into mechanical or photon energy and then converts the mechanical or photon energy back to electrical energy through a coupling effect. If an electrical bias is imposed on one side electrode of the PZT, a mechanical vibration is generated through the piezoelectric characteristics of the material and the other side electrode of the PZT is coupled to generate an electrical voltage. This phenomenon is termed the piezoelectric effect. Common PZT materials include ADP, Rochelle salt, etc. Since the PZT is small and thin, it is widely applied to driving back-light devices, such as the back-light cold-cathode tubes in the PDA or mobile phone displays and ultraviolet (UV) emitter, for years.

SUMMARY OF THE INVENTION

It is an object of the present invention to provide a control circuit which controls, through a logic control unit with input from a brightness adjuster control, a piezoelectric ceramic transform to drive back-light devices. The invention further provides a loop circuit for automatically scanning the response frequencies of the piezoelectric ceramic transformer and the back-light device and driving the back-light device at the best resonance frequency.

The invention takes a logic control unit to control the operation of the whole control circuit. Through the parameter setting of the logic control unit and the function of a feedback circuit, the piezoelectric transformer and back-light devices can be adjusted to operate under the best performance. The invention also provides control circuits with single-layer and multilayer piezoelectric ceramic transformers for driving back-light devices.

Other features and advantages of the present invention will be apparent from the following detailed description, which proceeds with reference to the accompanying drawings.

BRIEF DESCRIPTION OF THE DRAWINGS

In the various drawings, the same references relate to the same elements.

DETAILED DESCRIPTION OF THE INVENTION

The invention provides a circuit of using a piezoelectric ceramic transformer (PZT) to drive back-light devices. This method applies to back-light cold-cathode tubes and, in particular, to lighting up back-light cold-cathode tubes driven by a PZT with input from a brightness adjuster control. In addition, this method can suppress the brightness variation of the back-light cold-cathode tube without diminishing the efficiency of the PZT.

Figure 1:
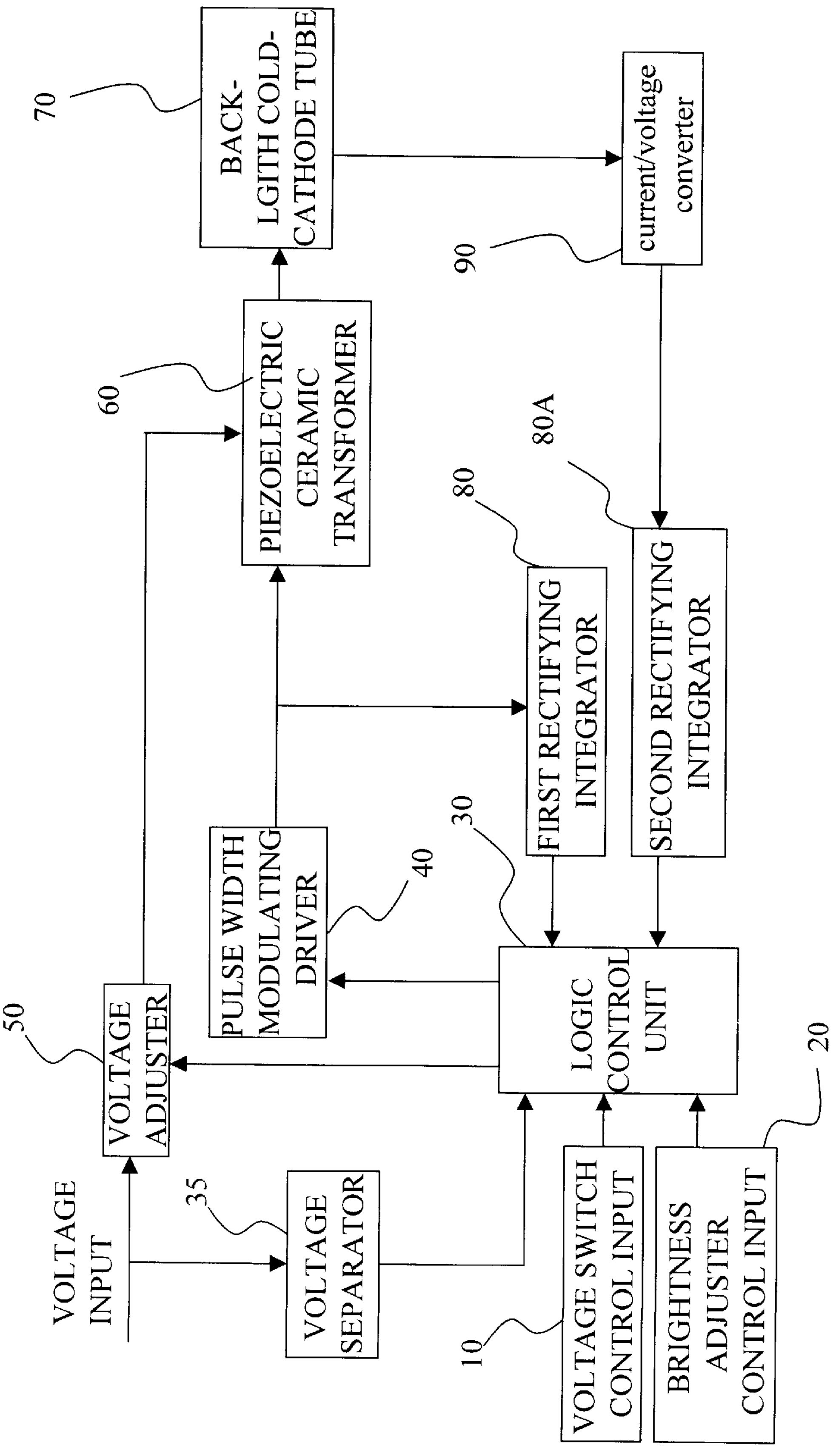
FIG. 1 is a block diagram illustrating the first embodiment circuit configuration of the invention.

The block diagram of one embodiment circuit configuration of the invention is shown in FIG. 1. A voltage switch control input 10 and a brightness adjuster control input 20 are connected to a logic control unit 30. One voltage input connects to the logic control unit 30 through a voltage separator 35 for driving the whole circuit. The logic control unit 30 outputs two control signals to a pulse width modulating driver 40 and a voltage adjuster 50, respectively. The logic control unit 30 used herein is a processor based logic control integrated circuit.

The signal output from the logic control unit 30 to the pulse width modulating driver 40 is a driving voltage control signal. The other signal is generated to adjust, through the voltage adjuster 50, an input voltage as the driving voltage of the PZT, which is controlled by both the logic control unit 30 and the brightness adjuster control input 20 and a feedback circuit. Moreover, the PZT 60 is a variable power amplifier. The driving voltage control signal is a pulse carrier voltage control signal generated through the combination of the feedback circuit and the brightness adjuster control input.

The voltage signal output from the PZT 60 drives a back-light device 70, such as a back-light cold-cathode tube, to keep the back-light cold-cathode tube 70 lighting up continuously. Driven by a high voltage with a high frequency, the voltage amplitude is kept above a certain threshold due to the characteristics of the back-light cold-cathode tube 70. Therefore, the back-light cold-cathode tube 70 can e lit up continuously.

The present invention provides a function of automatically scanning the response frequency of the PZT 60 so as to drive the back-light cold-cathode tube 70 at the best resonance frequency. The voltage signal output from the pulse width modulating driver 40 is fed through a first rectifying integrator 80 back to the logic control unit 30. The sinked current signal of the back-light cold-cathode tube 70 is converted by a current/voltage converter 90 into a feedback voltage. Through a second rectifying integrator 80A, this voltage is fed back to the logic control unit 30 to form a close loop circuit. The first and second rectifying integrators 80, 80A are low pass filters, which control and output the feedback signals from the PZT 60 and the back-light cold-cathode tube 70 as the control signals of the pulse width modulating driver 40 and the voltage adjuster 50 with the processing of the logic control unit 30. Thus the response frequency of the PZT 60 is automatically scanned and the best resonance frequency is found to drive the back-light cold-cathode tube 70.

Figure 2:
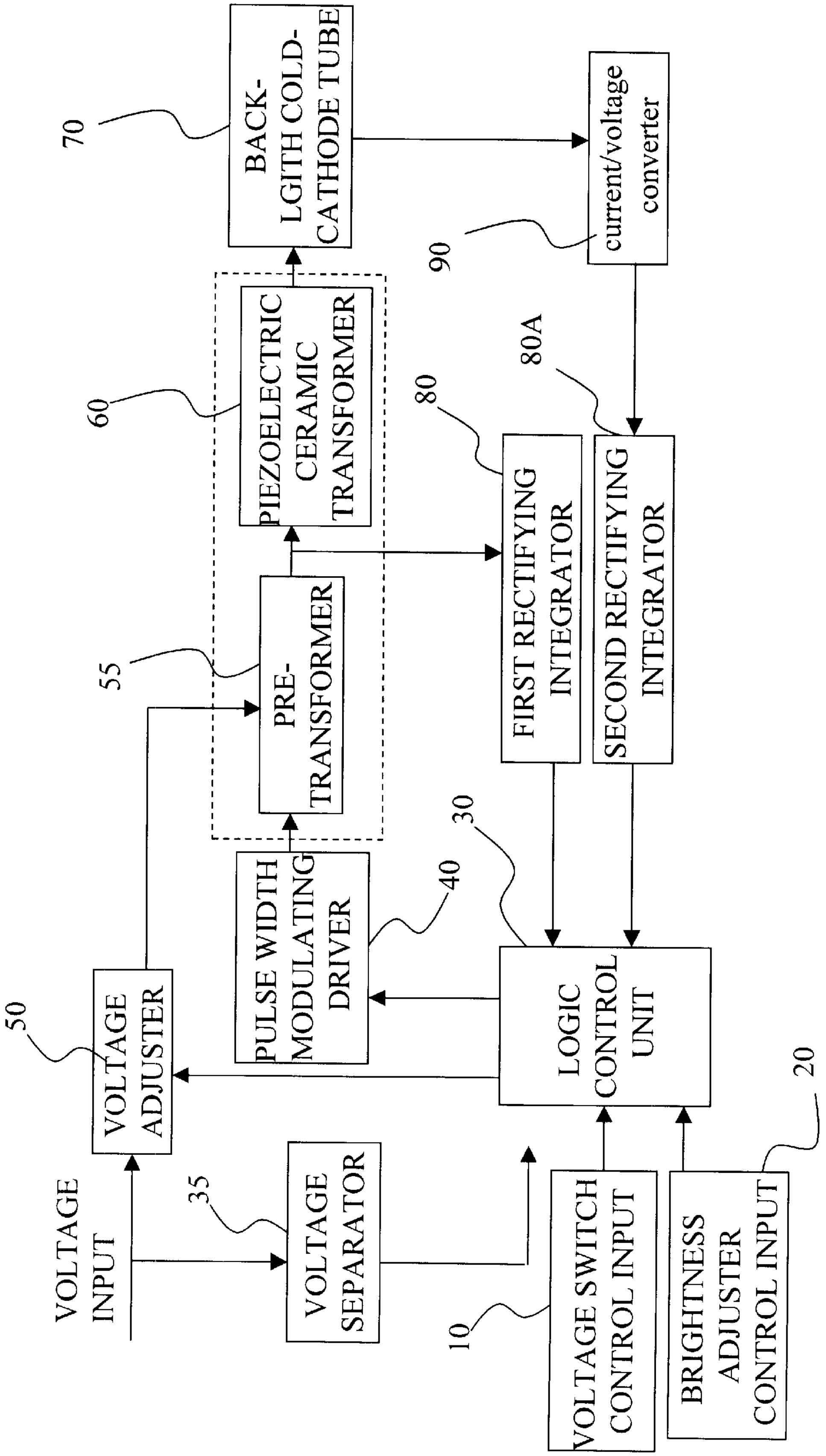
FIG. 2 is a block diagram illustrating the second embodiment circuit configuration of the invention.

PZTs 60 can be classified into single-layer PZTs and multilayer PZTs. The above embodiment utilizes a multilayer PZT. Another preferred embodiment is given hereinbelow to explain the feasibility of using a single-layer PZT in the invention. Please refer to FIG. 2, the block diagram of the second embodiment circuit configuration. Since the voltage rise of a single-layer PZT is lower than that of a multilayer PZT, a pre-transformer 55 is disposed before the single-layer PZT to raise the input voltage. This solves the problem of insufficient input voltage for driving the single-layer PZT.

Also shown in the drawing, the voltage adjuster 50 and the pulse width modulating driver 40 provide the driving voltage of the pre-transformer 55. The pulse carrier voltage control signal of the pre-transformer 55 is modulated by the logic control unit 30, the brightness adjuster control input 20 and the feedback circuit. The PZT 60 here is a variable power amplifier.

The output voltage signal from the pre-transformer 55 is fed through the first rectifying integrator 80 back to the logic control unit 30. The sinked current signal from the back-light cold-cathode tube 70 is converted into a feedback voltage by a current/voltage converter 90, which voltage is then fed through the second rectifying integrator 80A back to the logic control unit 30 to form a close loop circuit. The logic control unit 30 also control and output The feedback signals from the PZT 60 and the back-light cold-cathode tube 70 as the control signals of the pulse width modulating driver 40 and the voltage adjuster 50 so as to automatically scan the response frequency of the PZT 60 and to drive the back-light cold-cathode tube 70 at the best resonance frequency.

When a PZT 60 is used as the transformer of a back-light cold-cathode tube 70 in the prior art, the functions of the original circuit often can not be fully used once the PZT 60 is changed or replaced. The invention makes use of a logic control unit 30 and a feedback circuit to obtain the best performance and adjustment of the PZT 60 and the back-light cold-cathode tube 70.

While the present invention has been disclosed in reference to the preferred embodiments, it shall be understood by those skilled in the art that various changes, modifications and substitutions may be incorporated into such embodiments without departing from the spirit of the invention as defined by the claims appearing hereinafter.

What is claimed is:

1. A control circuit using a piezoelectric ceramic transformer (PZT) for driving a back-light device, which control circuit comprises:

a logic control unit receiving input from a voltage switch control input and a brightness adjuster control input and outputting to a voltage adjuster and a pulse width modulating driver, whose output signals provide a proper voltage for controlling the PZT and driving the back-light device;

a first feedback circuit, which couples the pulse width-modulating driver and the logic control unit through a first rectifying integrator; and a second feedback circuit, which couples the back-light device and the logic control unit through a second rectifying integrator.

2. The control circuit according to claim 1, wherein the back-light device can be a back-light cold-cathode tube.

3. The control circuit according to claim 1, wherein the second feedback circuit further comprises a current/voltage converter for converting the feedback voltage of the back-light device into a feedback current.

4. The control circuit according to claim 1, wherein the logic control unit is a logic control integrated circuit.

5. The control circuit according to claim 1, wherein the voltage input of the logic control unit is provided though a voltage separator.

6. The control circuit according to claim 1, wherein the PZT is a multilayer PZT.

7. A control circuit using a piezoelectric ceramic transformer (PZT) for driving a back-light device, which control circuit comprises:

a logic control unit receiving input from a voltage switch control input and a brightness adjuster control input and outputting to a voltage adjuster and a pulse width modulating driver, whose output signals provide a proper voltage for a pre-transformer to raise to control the PZT and to drive the back-light device;

a first feedback circuit, which couples the pre-transformer and the logic control unit through a first rectifying integrator; and a second feedback circuit, which couples the back-light device and the logic control unit through a second rectifying integrator.

8. The control circuit according to claim 7, wherein the back-light device can be a back-light cold-cathode tube.

9. The control circuit according to claim 7, wherein the second feedback circuit further comprises a current/voltage converter for converting the feedback current of the back-light device into a feedback voltage.

10. The control circuit according to claim 7, wherein the logic control unit is a logic control integrated circuit.

11. The control circuit according to claim 7, wherein the voltage input of the logic control unit is provided though a voltage separator.

12. The control circuit according to claim 7, wherein the PZT is a single-layer PZT.

13. A control circuit using a piezoelectric ceramic transformer (PZT) for driving a back-light device, which control circuit utilizes a logic control unit provided with a voltage switch control input and a brightness adjuster control input and outputting to a voltage adjuster and a pulse width modulating driver, whose output signals provide a proper voltage for controlling the PZT and driving the back-light device; the control circuit being characterized in that a first feedback circuit couples the output terminal of the PZT and the logic control unit through a first rectifying integrator, a second feedback circuit couples the back-light device and the logic control unit through a second rectifying integrator, so that the control circuit can automatically scan the frequencies of the PZT and the back-light device and drive the back-light device at the best resonance frequency.

14. The control circuit according to claim 13, wherein the back-light device can be a back-light cold-cathode tube.

15. The control circuit according to claim 13, wherein the second feedback circuit further comprises a current/voltage converter for converting the feedback current of the back-light device into a feedback voltage.

16. The control circuit according to claim 13, wherein the logic control unit is a logic control integrated circuit.

17. The control circuit according to claim 13, wherein the voltage input of the logic control unit is provided though a voltage separator.

18. The control circuit according to claim 13, wherein the PZT is a multilayer PZT.

19. The control circuit according to claim 13, wherein the PZT is a single-layer PZT.

* * * * *